(12) United States Patent
Huang et al.

(10) Patent No.: US 11,566,322 B2
(45) Date of Patent: Jan. 31, 2023

(54) SHADOW MASK WITH PLASMA RESISTANT COATING

(71) Applicant: Applied Materials, Inc., Santa Clara, CA (US)

(72) Inventors: Xi Huang, Shanghai (CN); Fei Peng, San Jose, CA (US); Kiran Krishnapur, Milpitas, CA (US); Ruiping Wang, San Jose, CA (US); Jrjyan Jerry Chen, Campbell, CA (US); Steven Verhaverbeke, San Francisco, CA (US); Robert Jan Visser, Menlo Park, CA (US)

(73) Assignee: APPLIED MATERIALS, INC., Santa Clara, CA (US)

( * ) Notice: Subject to any disclaimer, the term of this patent is extended or adjusted under 35 U.S.C. 154(b) by 1063 days.

(21) Appl. No.: 16/096,665

(22) PCT Filed: May 24, 2016

(86) PCT No.: PCT/CN2016/083114
§ 371 (c)(1),
(2) Date: Oct. 25, 2018

(87) PCT Pub. No.: WO2017/201669
PCT Pub. Date: Nov. 30, 2017

(65) Prior Publication Data
US 2021/0222291 A1    Jul. 22, 2021

(51) Int. Cl.
*C23C 16/04* (2006.01)
*C23C 16/44* (2006.01)
(Continued)

(52) U.S. Cl.
CPC ........ *C23C 16/042* (2013.01); *C23C 16/4405* (2013.01); *H01L 51/5253* (2013.01); *H01L 51/56* (2013.01)

(58) Field of Classification Search
None
See application file for complete search history.

(56) References Cited

U.S. PATENT DOCUMENTS

| 5,611,865 A | 3/1997 | White et al. |
| 2003/0221613 A1* | 12/2003 | Kang ........................ C25D 1/10 |
| | | 205/70 |

(Continued)

FOREIGN PATENT DOCUMENTS

| CN | 103451598 A | 12/2013 |
| CN | 203932122 U | 11/2014 |

(Continued)

OTHER PUBLICATIONS https://www.engineeringtoolbox.com/thermal-expansion-metals-d_859.html; accessed May 17, 2022.*

(Continued)

*Primary Examiner* — Jethro M. Pence
(74) *Attorney, Agent, or Firm* — Patterson & Sheridan, LLP

(57) ABSTRACT

A mask assembly (100) includes a mask frame (102) and a mask screen (104), both of the mask frame (102) and the mask screen (104) made of a metallic material, and a metal coating (125) disposed on exposed surfaces of one or both of the mask frame (102) and the mask screen (104).

13 Claims, 5 Drawing Sheets

(51) Int. Cl.
*H01L 51/52* (2006.01)
*H01L 51/56* (2006.01)

(56) References Cited

U.S. PATENT DOCUMENTS

| | | | | |
|---|---|---|---|---|
| 2003/0221614 | A1* | 12/2003 | Kang | .................... C23C 14/042 |
| | | | | 118/504 |
| 2008/0018236 | A1* | 1/2008 | Arai | .................... C23C 14/042 |
| | | | | 445/24 |
| 2012/0074433 | A1 | 3/2012 | Zhao et al. | |
| 2018/0002803 | A1 | 1/2018 | Niboshi et al. | |

FOREIGN PATENT DOCUMENTS

| | | |
|---|---|---|
| CN | 104979495 A | 10/2015 |
| CN | 105449126 A | 3/2016 |
| CN | 205247063 U | 5/2016 |
| JP | 1997125228 | 5/1997 |
| JP | H09125228 A | 5/1997 |
| JP | H 09125228 A | 5/1997 |
| JP | 2006207012 A | 8/2006 |
| JP | 2007224396 A | 9/2007 |
| JP | 2008184670 A | 8/2008 |
| JP | 2009009777 A | 1/2009 |
| JP | 2009144195 A | 7/2009 |
| JP | 2013112895 A | 6/2013 |
| JP | 2014-522916 A | 9/2014 |
| JP | 2014214367 A | 11/2014 |
| JP | 2014216191 A | 11/2014 |
| JP | 2015521373 A | 7/2015 |
| KR | 20030092790 A | 12/2003 |
| KR | 20060080480 A | 7/2006 |
| WO | 2013166951 A1 | 11/2013 |

OTHER PUBLICATIONS

Korean Office Action for Application No. 10-2018-7037169 dated Sep. 7, 2020.
Chinese Office Action for Application No. 201680085729.0 dated Aug. 19, 2020.
Japanese Office Action in related application JP2018561732 dated Sep. 28, 2020.
Chinese Office Action in related application CN 201680085729.0 dated Jun. 17, 2021.
International Seach Report and Written Opinion dated Jan. 25, 2017 for Application No. PCT/CN2016/083114.
Korean Office Action for Application No. KR 10-2018-7037169 dated Jul. 1, 2020.
Korean Office Action for Application No. 10-2021-7012082 dated May 4, 2021.
Korean Office Action for Application No. KR 10-2018-7037169 dated Jan. 16, 2020.
Chinese Office Action for Application No. CN 201680085729.0 dated Dec. 4, 2019.
Chinese Office Action in related application CN 201680085729.0 dated Mar. 10, 2021.
Korean Office Action in related matter KR 10-2018-7037169 dated Mar. 24, 2021.
Japanese Office Action for Application No. 2021-011686 dated Mar. 28, 2022.

* cited by examiner

SHADOW MASK WITH PLASMA RESISTANT COATING

BACKGROUND

Field of the Disclosure

Embodiments of the disclosure relate to a shadow mask for use in a deposition process, such as a chemical vapor deposition (CVD) process used in the manufacture of electronic devices. In particular, embodiments of the disclosure relate to a shadow mask utilized in an encapsulation process in the manufacture of organic light emitting diode (OLED) display devices.

Description of the Related Art

OLEDs are used in the manufacture of television screens, computer monitors, mobile phones, other hand-held devices, etc. for displaying information. A typical OLED may include layers of organic material situated between two electrodes that are all deposited on a substrate in a manner to form a matrix display panel having individually energizable pixels. The OLED is generally placed between two glass panels, and the edges of the glass panels are sealed to encapsulate the OLED therein.

There are many challenges encountered in the manufacture of such display devices. In some fabrication steps, the OLED material is encapsulated in one or more layers to prevent moisture from damaging the OLED material. During these processes, one or more masks are utilized to shield portions of the substrate that do not include the OLED material. The masks used in these processes must endure significant temperature differences. The temperature extremes cause thermal expansion and contraction of the mask, which may lead to cracks, bending or breakage of the mask, any one of which may cause contamination of portions of the substrate. Additionally, some of these processes utilize plasmas that may react with the material of the mask in a manner that creates particles, which may cause contamination of portions of the substrate.

Therefore, there is a continuous need for new and improved apparatus and processing methods using masks in forming OLED display devices.

SUMMARY

Embodiments of the disclosure provide a mask assembly for use in a deposition process in the manufacture of organic light emitting diode displays.

In one embodiment, a mask assembly is provided that includes a mask frame and a mask screen, both of the mask frame and the mask screen made of a metallic material, and a metal coating disposed on exposed surfaces of one or both of the mask frame and the mask screen.

In another embodiment, a mask assembly is provided that includes a mask frame and a mask screen, both of the mask frame and the mask screen made of a metallic material having a low coefficient of thermal expansion, an oxide coating disposed on exposed surfaces of one or both of the mask frame and the mask screen.

In another embodiment, a mask assembly is provided that includes a mask frame and a mask screen, both of the mask frame and the mask screen made of a nickel:iron alloy having a low coefficient of thermal expansion, and a metal coating disposed on exposed surfaces of one or both of the mask frame and the mask screen.

BRIEF DESCRIPTION OF THE DRAWINGS

So that the manner in which the above recited features of the present disclosure can be understood in detail, a more particular description of the disclosure, briefly summarized above, may be had by reference to embodiments, some of which are illustrated in the appended drawings. It is to be noted, however, that the appended drawings illustrate only typical embodiments of this disclosure and are therefore not to be considered limiting of its scope, for the disclosure may admit to other equally effective embodiments.

Figure 1A:
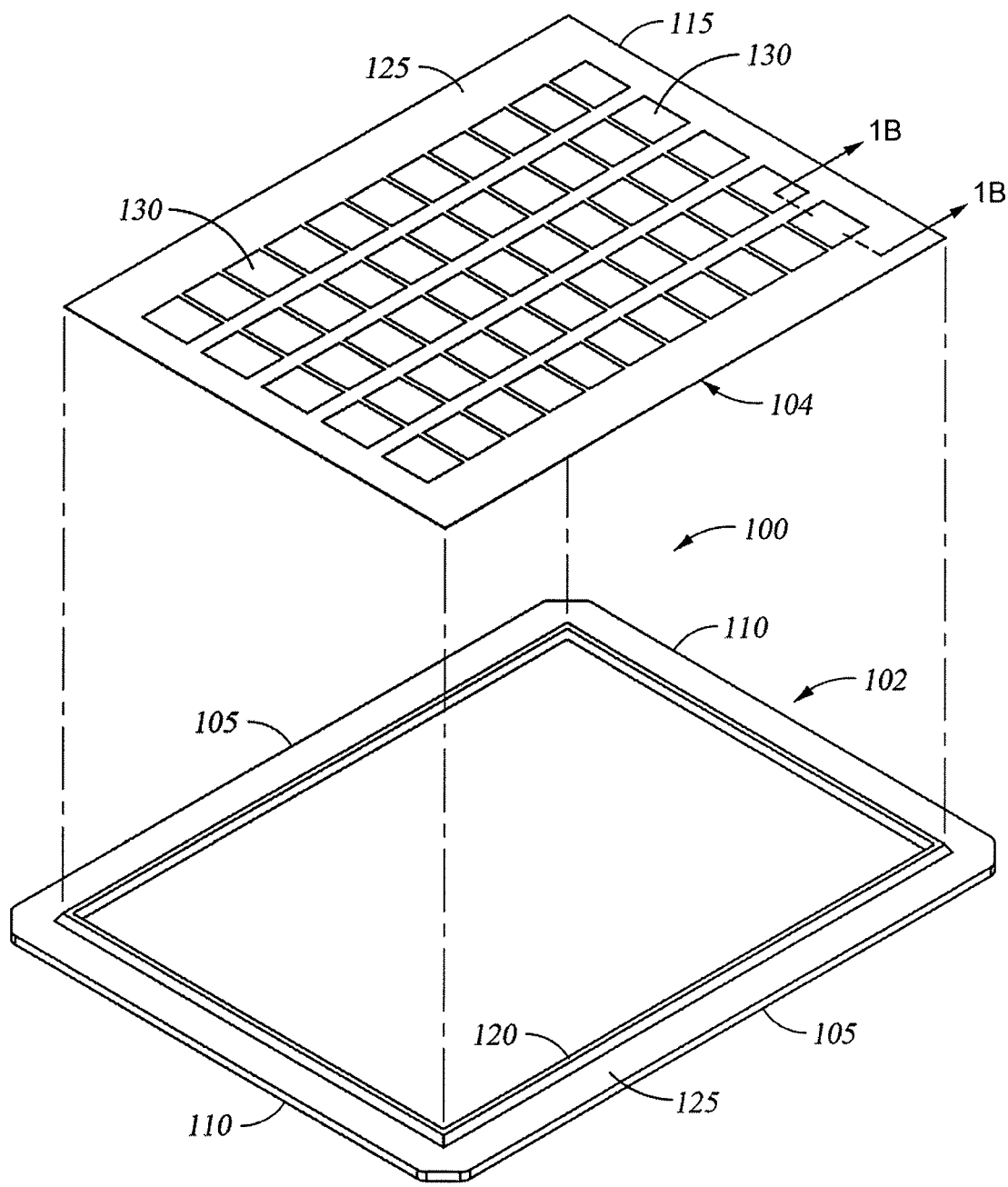
FIG. 1A is an isometric exploded view of one embodiment of a mask assembly according to embodiments disclosed herein.

To facilitate understanding, identical reference numerals have been used, wherever possible, to designate identical elements that are common to the figures. It is contemplated that elements and/or process steps of one embodiment may be beneficially incorporated in other embodiments without additional recitation.

DETAILED DESCRIPTION

Embodiments of the invention include a mask for use in a deposition chamber for a chemical vapor deposition (CVD) process, such as a CVD process chamber or a plasma-enhanced chemical vapor deposition (PECVD) process chamber that is operable to align the mask with respect to a substrate, position the mask on the substrate, and deposit an encapsulation layer on an OLED material formed on the substrate. The embodiments described herein may be used with other types of process chambers and are not limited to use with CVD or PECVD process chambers. The embodiments described herein may be used with other types of deposition processes and are not limited to use for encapsulating OLED's formed on substrates. The embodiments described herein may be used with various types, shapes, and sizes of masks and substrates. Embodiments disclosed herein may be practiced in chambers and/or systems available from AKT, Inc., a division of Applied Materials, Inc., of Santa Clara, Calif. Embodiments disclosed herein may also be practiced in chambers and/or systems from other manufacturers.

FIG. 1A is an isometric exploded view of one embodiment of a mask assembly 100 according to embodiments disclosed herein. The mask assembly 100 includes a mask frame 102 and a mask screen 104 that may be coupled to the mask frame 102. The mask frame 102 is rectangular and includes two opposing major sides 105 and two opposing minor sides 110. The sides 105 and 110 surround an opening where the mask screen 104 may be positioned. For example, a perimeter 115 of the mask screen 104 may be attached to a raised interior edge 120 of the mask frame 102. The mask screen 104 may be tensioned along a length and/or a width thereof and coupled to the interior edge 120 of the mask frame 102 via fasteners (not shown) or a welding process. When coupled to each other, the mask frame 102 and the mask screen 104 comprise the mask assembly 100 that may be positioned in a chamber (not shown) above a substrate having OLED devices formed thereon (not shown). The mask assembly 100 may be utilized to deposit materials onto portions of the substrate. The deposition materials may include silicon nitride (SiN) or other materials that encapsulate the OLED devices. The deposition materials may be deposited utilizing CVD or PECVD techniques. The chamber, and interior components thereof, such as the mask assembly 100, may also be cleaned periodically using a plasma containing fluorine.

The mask frame 102 and/or the mask screen 104 may be made of a material having a low coefficient of thermal expansion (CTE). The low CTE material prevents or minimizes movement of the mask frame 102 relative to a substrate (not shown) when temperature changes are experienced. The low CTE material may also prevent or minimize movement of, or between, openings 130 formed through the mask screen 104 when temperature changes are experienced. Examples of materials having a low CTE include molybdenum (Mo), titanium (Ti), chromium (Cr), tungsten (W), tantalum (Ta), vanadium (V), alloys thereof and combinations thereof. In some embodiments, one or both of the mask frame 102 and the mask screen 104 may be made from a metallic material that may react with gases utilized in the chamber where the mask assembly 100 is used. Examples may include alloys of iron (Fe) and nickel (Ni), alloys of Fe, Ni and cobalt (Co), among other low CTE materials. Examples of Fe:Ni alloys and Fe:Ni:Co alloys may include metals marketed under the trade names INVAR® (Fe:Ni 36), SUPER INVAR 32-5®, among others. The low CTE material maintains dimensional stability in the mask assembly 100, which provides accuracy of the deposited materials. Low CTE materials or metals as described herein may be a CTE of less than or equal to about 15 microns/meter/degrees Celsius, such as less than or equal to about 14 microns/meter/degrees Celsius, for example less than or equal to about 13 microns/meter/degrees Celsius.

One or both of the mask frame 102 and the mask screen 104 may include a coating 125 as one or more of the low CTE materials may react with chemistries utilized in the environment of the chamber where the mask assembly 100 is utilized. In one example, fluorine radicals in plasma used to clean the chamber may react with the low CTE material of the mask assembly 100 containing iron to form iron fluoride (FeFx), which can generate particles. The coating 125 may be utilized to protect the mask frame 102 and/or the mask screen 104 from the plasma to reduce particles. The coating 125 may also be utilized to protect the mask frame 102 and/or the mask screen 104 in order to extend the lifetime thereof.

The dimensions of the mask assembly 100 may be determined by the surface area of a substrate to be processed. In some embodiments, the length X width may be about 920 millimeters (mm) by about 730 mm for a Generation 4.5 substrate (G 4.5), about 1,500 mm by about 925 mm for a G 6 half-cut substrate, about 2,200 mm by about 1,250 mm for a G 8.5 half-cut substrate, or any other substrate size. The mask assembly 100 may include the mask frame 102 and one or more mask screens, such as the mask screen 104, suitable for use on substrates of any generation. While the dimensions of the mask frame 102 may be different for different substrate sizes and the mask screen 104 surface area may differ, the size of the openings 130 may be the same as the dimensions are based on the size of the OLED devices formed on the substrate.

Figure 1B:
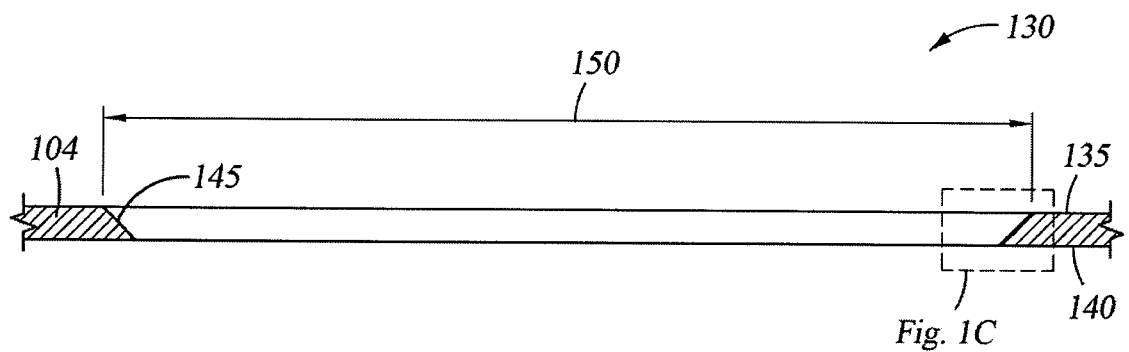
FIG. 1B is an enlarged cross-section of an opening along lines 1B-1B of FIG. 1A.

FIG. 1B is an enlarged cross-section of an opening 130 along lines 1B-1B of FIG. 1A. The mask screen 104 includes a first side 135 and a second side 140, and the second side 140 is adapted to contact a substrate during processing. The opening 130 is formed between the first side 135 and the second side 140. The opening 130 may include a tapered sidewall 145 that tapers toward inward from the first side 135 to the second side 140. The opening 130 may be rectangular and include a major dimension 150 of about 90 mm to about 100 mm. A minor dimension (not shown) normal to the direction of measurement of the major dimension 150 may be about 60 mm to about 65 mm. The opening 130 shown in FIG. 1B may be common to all openings 130 in the mask screen 104. Further, as only two sidewalls are shown, the profile of the sides may be the same for all four sides.

FIG. 10 is an enlarged view of a portion of the opening 130 of FIG. 1B. The coating 125 is clearly shown in cross-section on the mask screen 104. A thickness of the coating 125 may be about 1 micron (μm) to about 5 μm, such as about 1 μm to about 5 μm, or greater. In some embodiments, the coating 125 may include an oxide material including aluminum oxide ($Al_2O_3$), yttrium oxide ($Y_2O_3$), or combinations thereof (among other oxides), disposed on a Ni:Fe material (i.e., the body of the mask screen 104). In other embodiments, the coating 125 may include a Ni layer disposed on a Ni:Fe material (i.e., the body of the mask screen 104). While not shown, the coating 125 may cover all the surfaces of the mask screen 104 as well as exposed surfaces of the opening(s) 130. Additionally, while not shown, the coating may cover all exterior and/or exposed surfaces of the mask frame 102, including holes or depressions formed thereon or therein.

The coating 125, when metallic, may be formed by electroless deposition or plating techniques, electrolytic plating techniques, or a combination thereof, as well as other suitable deposition or plating technique. The coating 125 may comprise Ni, Ni:Co, or other Ni alloy in some embodiments. In other embodiments, the coating 125 may comprise a metal from the platinum-group elements, such as ruthenium (Ru), rhodium (Rh), or palladium (Pd), among others. In other embodiments, gold (Au), or other metals that are resistant to fluorine containing gases, may be used for the coating 125. The coating 125, when oxide, may be formed by any suitable deposition technique.

Figure 2:
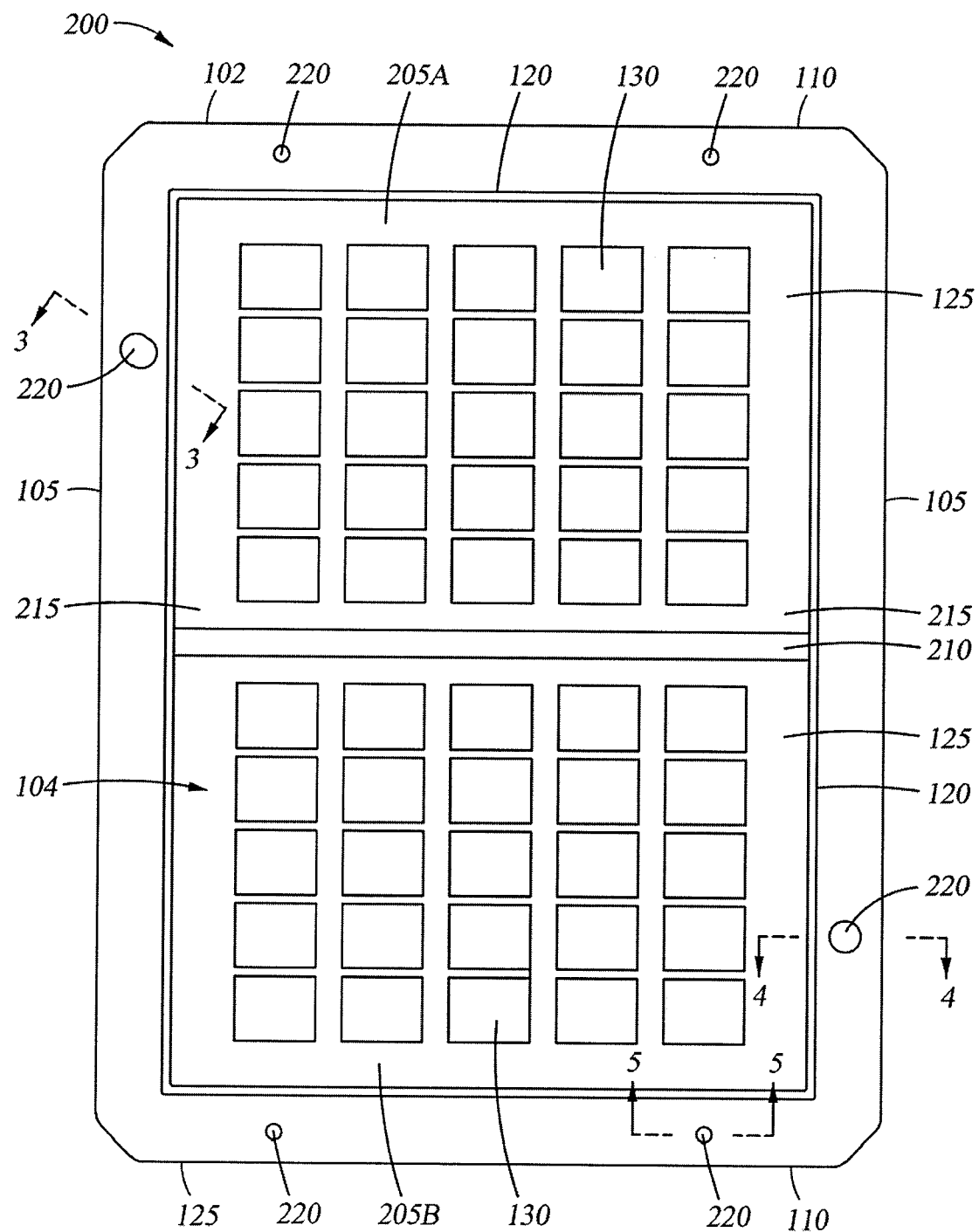
FIG. 2 is a plan view of another embodiment of a mask assembly.

FIG. 2 is a plan view of another embodiment of a mask assembly 200. The mask assembly 200 includes another embodiment of a mask screen 104 having one or more screen sections 205A and 205B coupled to an interior edge 120 of the mask frame 102. A rectangular strip 210 may be used to separate the screen sections 205A and 205B. The strip 210 may be an integral part of the mask frame 102 or be coupled to the mask frame 102 via fasteners or welding. The strip 210 may be made of the same materials as the mask frame 102 and the mask screen 104. The strip 210 may also be used to couple interior edges 215 of the screen sections 205A and 205B to the mask frame 102. For example, the interior edges 215 of the screen sections 205A and 205B may be coupled to the strip 210 by fasteners or welding. The strip 210 may be utilized to enlarge the dimensions of the mask assembly 200 such that a length or width thereof may permit use thereof on substrates having larger surface areas. The strip 210 may alternatively be utilized to minimize the surface area of the screen sections 205A and 205B, which may provide simpler fabrication and coating of the screen sections 205A and 205B. Although only one strip 210 and two screen sections 205A and 205B are shown, the mask assembly 200 may include multiple strips similar to the strip 210 to facilitate attachment of more than two, or smaller, mask sections. In some embodiments, when multiple screen sections are utilized with a single mask frame 102, the strip 210 (or multiple strips) is not utilized. Instead, the screen sections may be fastened to each other, such as by welding each of the interior edges of the screen sections to each other. Exterior portions of the screen sections not coupled to each other may then be fastened to the mask frame 102.

The mask frame 102 may include one or more indexing features 220 formed thereon. For example, the minor sides 110 may include a plurality of indexing features 220 formed in a surface thereof. The major sides 105 may also include the indexing features 220.

Figure 3:
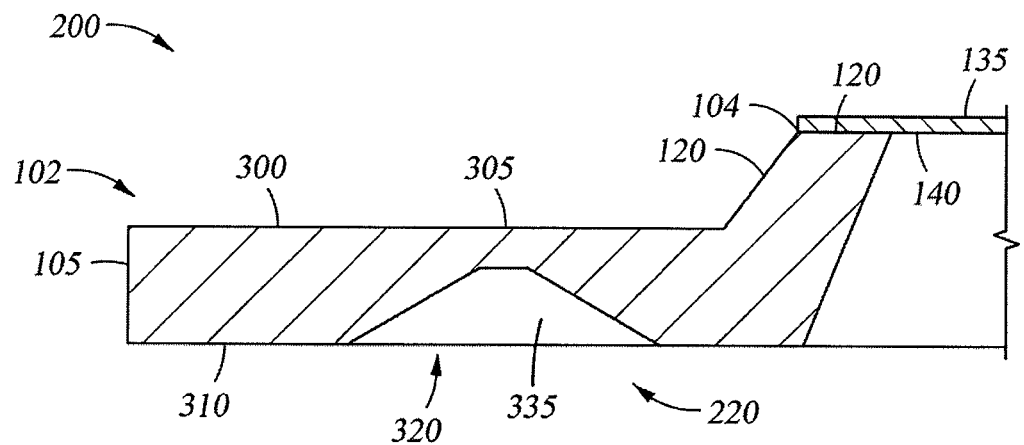
FIG. 3 is a cross-sectional view of a portion of the mask assembly along lines 3-3 of FIG. 2.
Figure 4:
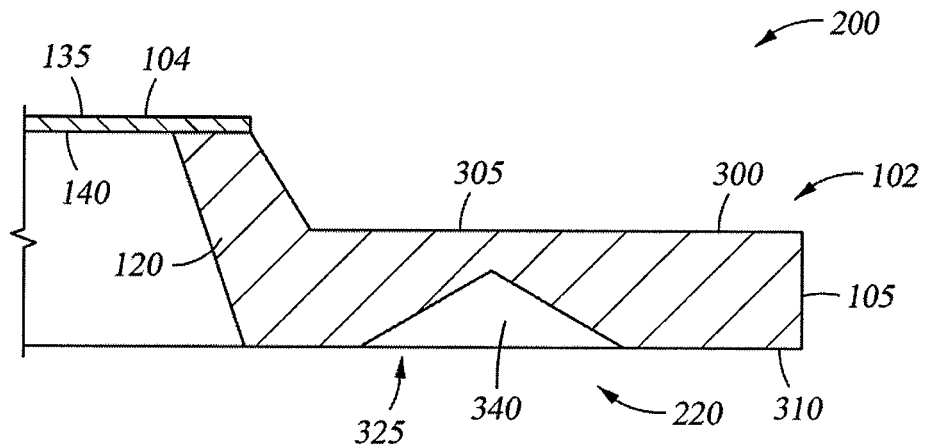
FIG. 4 is a cross-sectional view of a portion of the mask assembly along lines 4-4 of FIG. 2.
Figure 5:
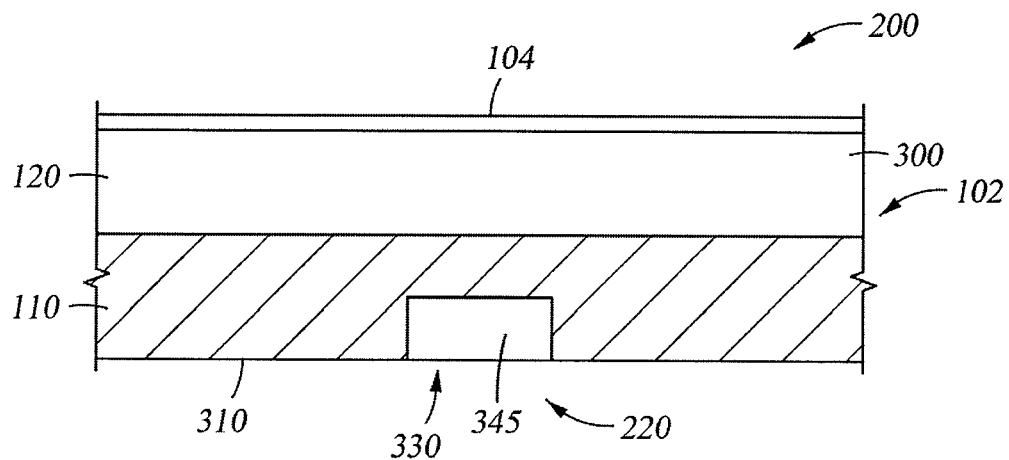
FIG. 5 is a cross-sectional view of a portion of the mask assembly along lines 5-5 of FIG. 2.

FIGS. 3-5 are cross-sectional views of portions of the mask assembly 200 of FIG. 2. FIG. 3 is a cross-sectional view of a portion of the mask assembly 200 along lines 3-3 of FIG. 2. FIG. 4 is a cross-sectional view of a portion of the mask assembly 200 along lines 4-4 of FIG. 2. FIG. 5 is a cross-sectional view of a portion of the mask assembly 200 along lines 5-5 of FIG. 2.

The mask frame 102 includes a body 300 made of a low CTE material as described above. The body 300 also includes a first surface 305 and a second surface 310 that is opposite the first surface 305. The second surface 310 is adapted to contact a surface of a chamber component (not shown) during processing, such as a substrate support or a susceptor. A plane of the mask screen 104 is offset from a plane of both of the first surface 305 and the second surface 310, and the second side 140 is adapted to contact a substrate during processing.

As mentioned above, the second surface 310 of the mask frame 102 includes a one or more indexing features 220, such as depressions or blind holes formed therein. For example, the major sides 105 include a plurality of first depressions 320 and 325, and the minor sides 110 include a plurality of second depressions 330. One of the first depressions 320 comprises a trapezoidal feature 335. Another of the first depressions 320 comprises a triangular feature 340. Each of the second depressions 330 may comprise a rectangular feature 345. When the mask frame 102 is coated as described herein, all of the surfaces of the indexing features 220 include the coating 125.

Figure 1C:
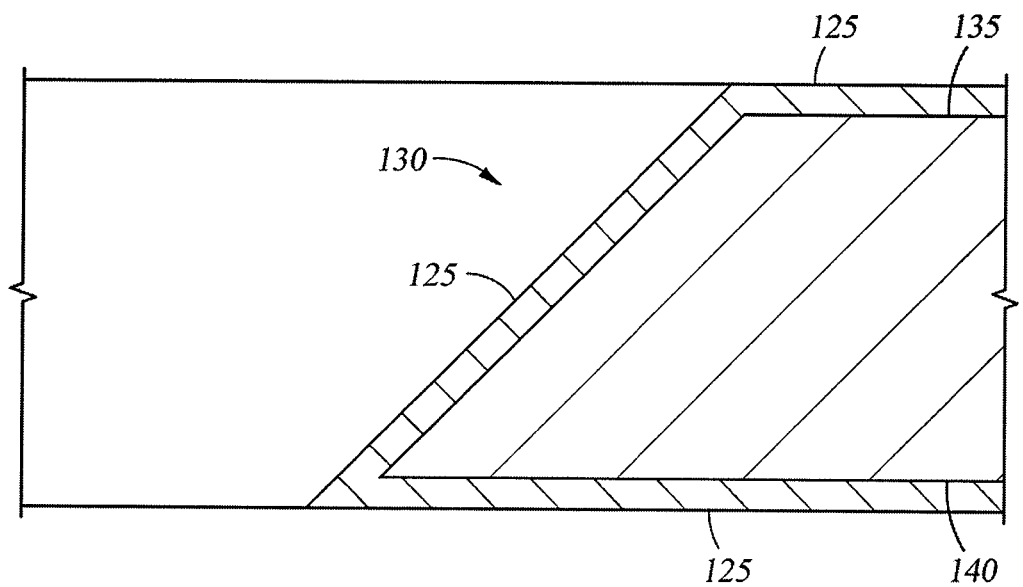
FIG. 1C is an enlarged view of a portion of an opening of FIG. 1B.
Figure 6:
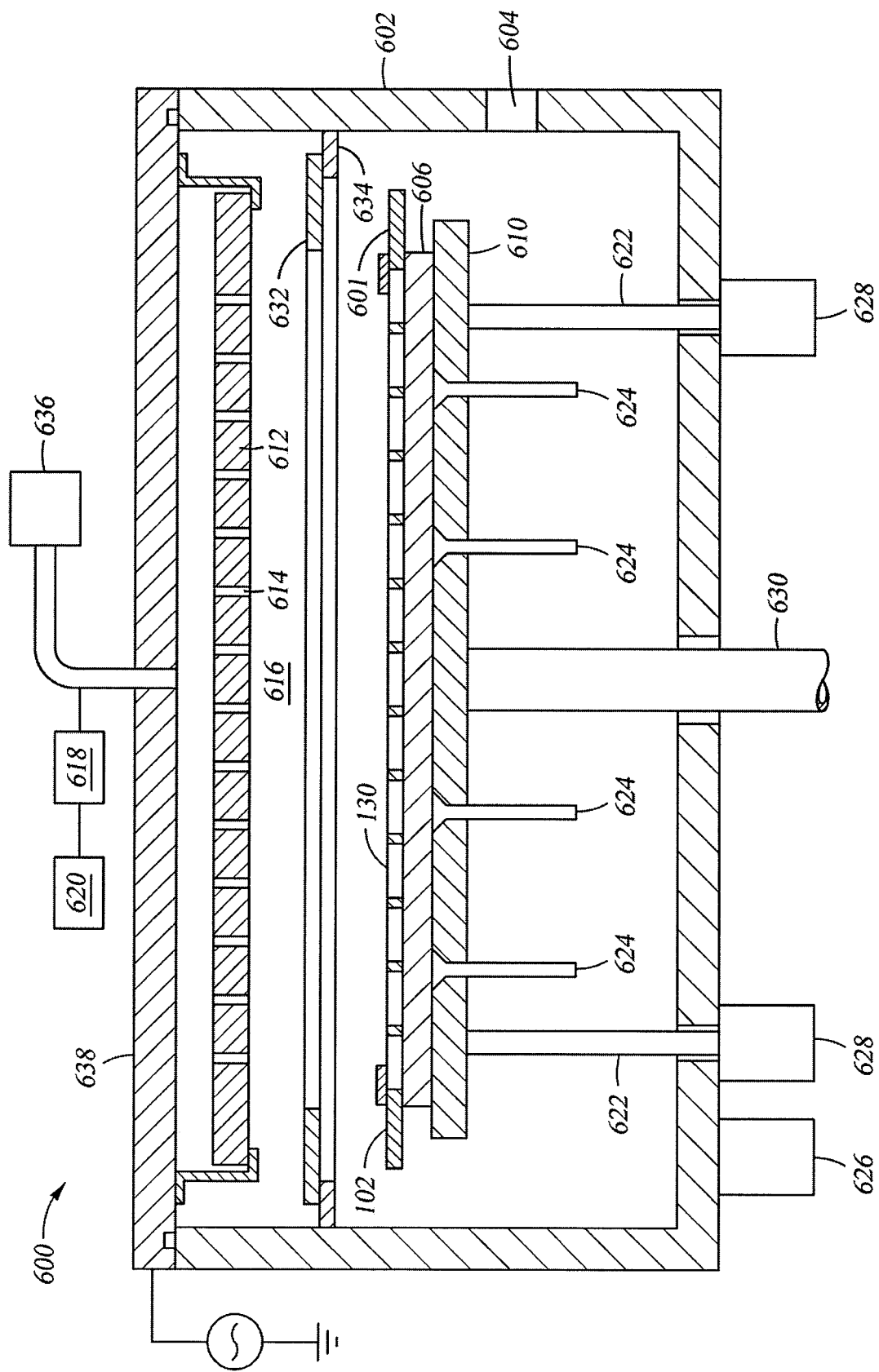
FIG. 6 is a schematic cross-sectional view of a CVD apparatus wherein the mask assemblies as described herein may be utilized.

FIG. 6 is a schematic cross-sectional view of a CVD apparatus 600 according to one embodiment wherein a mask assembly 601 may be used to deposit an encapsulation layer on a substrate. The mask assembly 601 may be either one of the mask assembly 100 of FIG. 1 or the mask assembly 200 of FIG. 2.

The CVD apparatus 600 includes a chamber body 602 having an opening 604 through one or more walls to permit one or more substrates 606 and the mask assembly 601 to be inserted therein. The substrate 606, during processing, is disposed on a substrate support 610 opposite a diffuser 612. The diffuser 612 includes one or more openings 614 formed therethrough to permit processing gas to enter a processing space 616 between the diffuser 612 and the substrate 606.

The substrate 606 may be used to form an OLED display where OLED(s) are formed on the surface of the substrate 606 by sequential deposition processes. The substrate 606 may be used to form a single display or multiple displays, and each display includes a plurality of OLEDs coupled to an electrical contact layer formed about a perimeter of each display.

During manufacture, the OLED portion of each display is encapsulated in one or more layers comprising silicon nitride, aluminum oxide, and/or a polymer to protect the OLEDs from the environment. The encapsulation material may be deposited by CVD and the mask assembly 601 is used to shield the electrical contact layer during deposition of the encapsulation material. The mask assembly 601 includes a mask frame 102 that shields the electrical contact layer during CVD processes.

For processing, the mask assembly 601 is initially inserted into the apparatus 600 through the opening 604 and disposed upon multiple motion alignment elements 622. The substrate 606 is then inserted though the opening 604 and disposed upon multiple lift pins 624 that extend through the substrate support 610. The substrate support 610 then raises to meet the substrate 606 so that the substrate 606 is disposed on the substrate support 610. The substrate 606 is aligned while on the substrate support 610.

Once the substrate 606 is aligned on the substrate support 610, one or more visualization systems 626 determine whether the mask assembly 601 is properly aligned over the substrate 606. If the mask assembly 601 is not properly aligned, then one or more actuators 628 move one or more motion alignment elements 622 to adjust the location of the mask assembly 601. The one or more visualization systems 626 then recheck the alignment of the mask assembly 601.

Once the mask assembly 601 is properly aligned over the substrate 606, the mask assembly 601 is lowered onto the substrate 606, and then the substrate support 610 raises on a stem 630 until a shadow frame 632 contacts the mask assembly 601. The shadow frame 632, prior to resting on the mask assembly 601, is disposed in the chamber body 602 on a ledge 634 that extends from one or more interior walls of the chamber body 602. The substrate support 610 continues to rise until the substrate 606, mask assembly 601 and shadow frame 632 are disposed in the processing position opposite the diffuser 612. Processing gas is then delivered from one or more gas sources 636 through an opening formed in a backing plate 638 while an electrical bias is provided to the diffuser 612 to form a plasma in the processing space 616 between the diffuser 612 and the substrate 606. The processing space 616 may also be cleaned periodically by providing a plasma from a remote plasma system 618 to the interior of the chamber body 602. The remote plasma system 618 may be coupled to a cleaning gas source 620, which consists of fluorine containing gases. Temperatures during processing and/or cleaning may be about 80 degrees Celsius (° C.) to about 100° C., or greater.

A mask assembly for a deposition process is provided. The mask assemblies 100, 200 and 601 as described herein provide a longer lifetime as well as reduced particle generation, which increases yield and minimizes cost of ownership. Embodiments of the mask assemblies 100, 200 and 601 with the coating 125 as described herein prevent reactions with fluorine chemistries which minimizes particle generation and maintains integrity of the portions of the mask assemblies 100, 200 and 601 having the coating 125. Embodiments of the mask assemblies 100, 200 and 601 with the coating 125 as described herein has been shown to double, triple or even quadruple lifetimes of the mask assemblies 100, 200 and 601.

While the foregoing is directed to embodiments of the present disclosure, other and further embodiments of the disclosure may be devised without departing from the basic scope thereof. Therefore, the scope of the present disclosure is determined by the claims that follow.

We claim:

1. A mask assembly, comprising:
a mask frame and a mask screen coupled to a first side of the mask frame, both of the mask frame and the mask screen made of a metallic material containing iron; and
a fluorine plasma resistant metal coating disposed on all exposed surfaces of the mask screen, wherein the mask frame comprises one or more indexing features, and each of the indexing features include a blind hole positioned on a second side of the mask frame opposite to the first side on which the mask screen is coupled.

2. The mask assembly of claim 1, wherein the metallic material comprise a nickel:iron alloy.

3. The mask assembly of claim 2, wherein the metal coating comprises a nickel material.

4. The mask assembly of claim 2, wherein the metal coating comprises a metal selected from platinum-group elements.

5. The mask assembly of claim 2, wherein the metal coating is selected from the group consisting of a nickel alloy, ruthenium, rhodium, palladium and gold.

6. The mask assembly of claim 1, wherein the metal coating comprises a thickness of about 1 micron to about 35 microns.

7. The mask assembly of claim 1, wherein the metallic material comprises a metal having a low coefficient of thermal expansion.

8. The mask assembly of claim 7, wherein the metal coating comprises a nickel material.

9. The mask assembly of claim 7, wherein the metal coating comprises a metal selected from platinum-group elements.

10. The mask assembly of claim 7, wherein the metal having a low coefficient of thermal expansion has a coefficient of thermal expansion less than or equal to 15 microns/meter/degrees Celsius.

11. The mask assembly of claim 10, wherein the metal having a low coefficient of thermal expansion has a coefficient of thermal expansion less than or equal to 14 microns/meter/degrees Celsius.

12. The mask assembly of claim 11, wherein the metal having a low coefficient of thermal expansion has a coefficient of thermal expansion less than or equal to 13 microns/meter/degrees Celsius.

13. The mask assembly of claim 12, wherein the metal coating comprises a thickness of about 1 micron to about 35 microns.

* * * * *